(12) United States Patent
Jang et al.

(10) Patent No.: US 7,199,462 B2
(45) Date of Patent: Apr. 3, 2007

(54) SUBSTRATE FOR PRODUCING SEMICONDUCTOR PACKAGES

(75) Inventors: Chang-soo Jang, Yongin-si (KR); Jae-chul Ryu, Yongin-si (KR); Dong-kwan Won, Yongin-si (KR)

(73) Assignee: Samsung Techwin Co., Ltd. (KR)

( * ) Notice: Subject to any disclaimer, the term of this patent is extended or adjusted under 35 U.S.C. 154(b) by 141 days.

(21) Appl. No.: 11/133,727

(22) Filed: May 20, 2005

(65) Prior Publication Data

US 2006/0038280 A1  Feb. 23, 2006

(30) Foreign Application Priority Data

Aug. 21, 2004 (KR) ............... 10-2004-0066169

(51) Int. Cl.
*H01L 23/12* (2006.01)

(52) U.S. Cl. ..................... 257/700; 257/678

(58) Field of Classification Search ........... 257/700, 257/701, 678
See application file for complete search history.

(56) References Cited

FOREIGN PATENT DOCUMENTS

| | | |
|---|---|---|
| JP | 2000299359 | 10/2000 |
| KR | 1020030022703 A | 3/2003 |
| KR | 1020030070423 A | 8/2003 |
| KR | 1020030072953 A | 9/2003 |

*Primary Examiner*—Roy Karl Potter
(74) *Attorney, Agent, or Firm*—Tuchman & Park LLC (57) ABSTRACT

A parent or master substrate for a semiconductor package is provided, which can provide a plurality of unit substrates by cutting into pieces for producing a semiconductor device. The parent substrate includes an insulation layer, conductor patterns formed on first and second surfaces of the insulation layer, and PSR (photo solder resist) layers respectively formed on the first and second surfaces of the insulation layers and covering the conductor patterns. The parent substrate includes an upper part and a lower part divided by a reference surface which passes through the center of the insulation layer. When an equivalent thermal expansion coefficient $\alpha_{upper}$ of the upper part is defined by the Equation of

$$\alpha_{upper} = \frac{\sum_{i=1}^{n} \alpha_i \times E_i \times v_i}{\sum_{i=1}^{n} E_i \times v_i},$$

where $\alpha_i$ is respective thermal expansion coefficients of, $E_i$ is respective elastic moduli of, and $v_i$ is respective volume ratios of first through $n^{th}$ components constituting the upper part (e.g., insulation layer, conductor patterns, and PSR layers of the upper part), and an equivalent thermal expansion coefficient $\alpha_{lower}$ of the lower part is defined by the Equation of $$\alpha_{lower} = \frac{\sum_{j=1}^{m} \alpha_j \times E_j \times v_j}{\sum_{j=1}^{m} E_j \times v_j},$$

where $\alpha_j$ is respective thermal expansion coefficients of, $E_j$ is respective elastic moduli of, and $v_j$ is respective volume ratios of first through $m^{th}$ components constituting the lower part (e.g., insulation layer, conductor patterns, and PSR layers of the lower part), a equivalent thermal expansion ratio ($\alpha_{upper}/\alpha_{lower}$) of $\alpha_{upper}$ to $\alpha_{lower}$ is selected to be within a range of 0.975 through 1.165.

8 Claims, 7 Drawing Sheets

SUBSTRATE FOR PRODUCING SEMICONDUCTOR PACKAGES

This application claims priority of Korean Patent Application No. 10-2004-0066169, filed on Aug. 21, 2004, in the Korean Intellectual Property Office, the disclosure of which is incorporated herein in its entirety by reference.

FIELD OF THE INVENTION

The present invention relates to a parent or master substrate for providing semiconductor packages and unit substrates formed from the parent or master substrate, in which the bending deformation of the substrate can be reduced.

DESCRIPTION OF THE RELATED ART

One major trend in the semiconductor packaging techniques is aimed for reducing the size or outline of a semiconductor package so that the semiconductor package attached on a circuit board can have a low height and occupy a smaller area. Pursuant to this modern trend, a board-on-chip package has been developed, in which a semiconductor chip attached on a unit substrate occupies about the same area as the size of the semiconductor chip. For example, in a typical board-on-chip package, the substrate has a surface area occupying not more than about 1.2 times of the size of the semiconductor chip.

Figure 1:
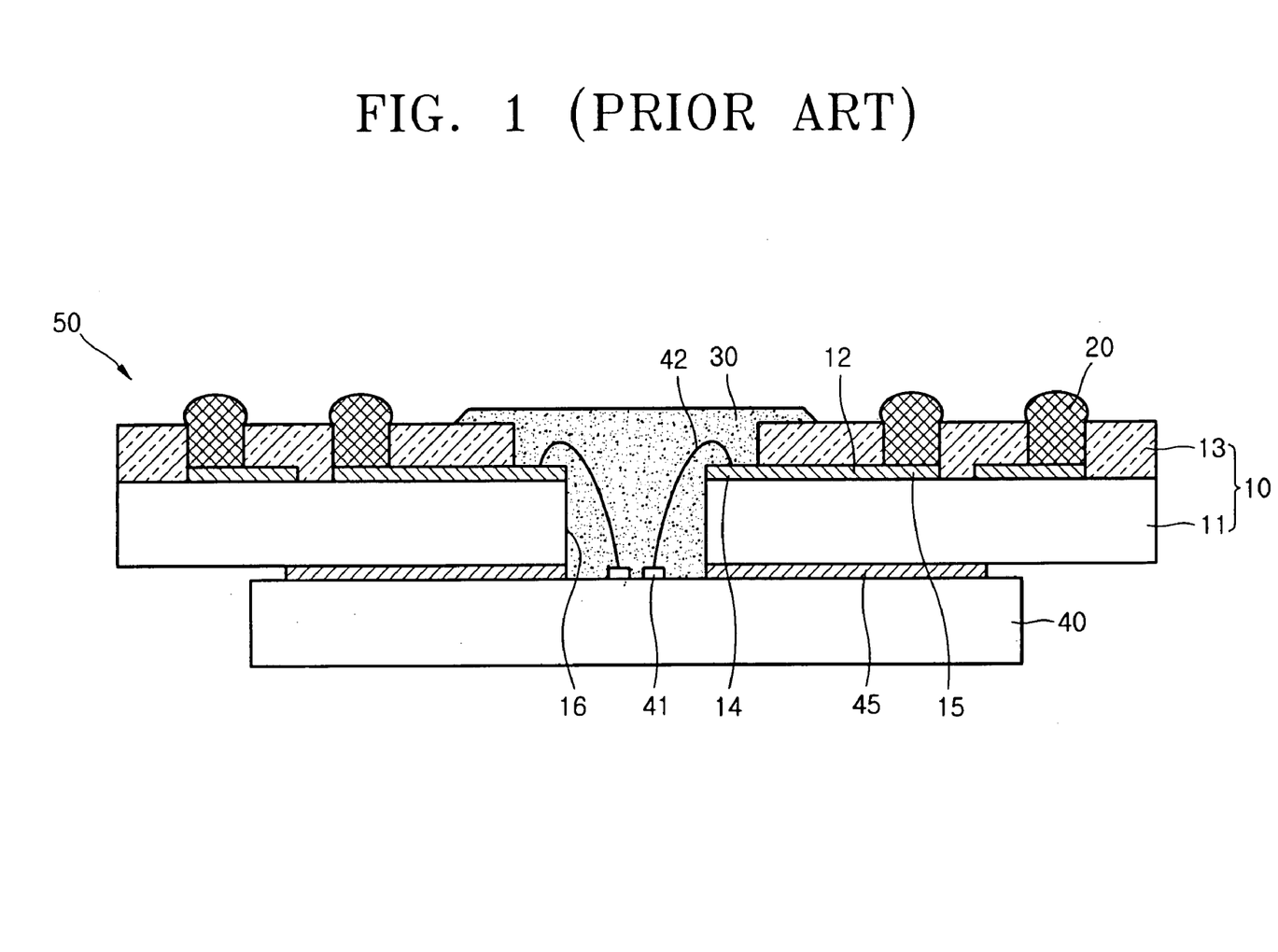
FIG. 1 is a sectional view of the conventional semiconductor package.

FIG. 1 is a sectional view of a conventional board-on-chip package. Referring to FIG. 1, board-on-chip package 50 includes a semiconductor chip 40 having electrode pads 41 formed on an upper central area of the semiconductor chip 40. The semiconductor chip 40 is joined to a unit substrate 10 via an insulating adhesive 45. The pads 41 of the semiconductor chip 40 are connected with wire-bonding pads 14 of the unit substrate 10 by conductive wires 42 through a slit 16 formed in the unit substrate 10. In order to protect wire-bonding parts from the outer environment, at least some portion of the upper surface (seen from the view of FIG. 1) of the semiconductor chip 40 and the unit substrate 10 is covered with encapsulating resin 30.

Referring still to FIG. 1, a circuit pattern 12 electrically connects the wire-bonding pads 14 with ball pads 15, and a photo solder resist layer 13 is formed on an insulation layer 11 and covers the circuit pattern 12. Solder balls 20 are formed on the ball pad 15 and exposed to the outside of the resist layer 13 for electrically connecting the board-on-chip package 50 with an outer circuit board (not shown).

In the semiconductor package fabrication process, a plurality of unit substrates are formed in a parent or master substrate in a matrix pattern, and a semiconductor chip is mounted on each of the unit substrates, and then the fabricated packages are divided into a plurality of individual semiconductor packages through a cutting process. For fabricating the parent or master substrate, a circuit conductive pattern (typically of copper) is formed on an insulation layer of FR-4 or BT, a liquid photo solder resist is coated on the insulation layer so as to cover the circuit pattern, and the liquid photo solder resist is cured or hardened to a photo solder resist layer at high temperature. However, when the heated parent substrate (with the photo solder resist layer applied thereon) is cooled to an ambient temperature, it can be easily bent because of the difference in the respective thermal expansion coefficients of the photo solder resist layer, the circuit pattern and the insulation layer. Such a deformation can also be transferred to the unit substrates, which are sawed into pieces from the parent substrate. The deformation in the unit substrates causes a height difference among the solder balls seating on the ball pads of the unit substrate. Accordingly, because of the height difference in the solder balls, it is difficult to make a secured connection between the semiconductor package and an outer circuit board, thus often causing a bad contact there-between. It is also difficult to properly handle the bent parent substrate during the subsequent processes, such as a semiconductor chip mounting process and a unit substrate cutting process which are to be performed after the formation of the parent substrate.

SUMMARY OF THE INVENTION

The present invention provides a parent (or master) substrate for a semiconductor package and unit substrates manufactured from the parent substrate, which can reduce their bending deformations during fabrication of semiconductor devices.

The present invention also provides a parent substrate for a semiconductor package, which can be easily handled during the subsequent processes performed after formation of the parent substrate without excessive burdens for controlling the planarity of the substrate.

According to one aspect of the present invention, there is provided a parent substrate for producing a plurality of unit substrates for a semiconductor device, in which the parent substrate comprises: an insulation layer having first and second surfaces opposing to each other; upper and lower conductor patterns respectively formed on the first and second surfaces of the insulation layer; and upper and lower photo solder resist (PSR) layers respectively formed over the first and second surfaces of the insulation layers and covering at least some area of the upper and lower conductor patterns. When the parent substrate defines an upper part and a lower part divided by a reference surface passing through the center line of the insulation layer, an equivalent thermal expansion coefficient $\alpha_{upper}$ of the upper part is defined by the equation of:

$$\alpha_{upper} = \frac{\alpha_b E_b v_b + \alpha_c E_c v_c + \alpha_p E_p v_p}{E_b v_b + E_c v_c + E_p v_p},$$

where $\alpha_b$, $\alpha_c$ and $\alpha_p$ are thermal expansion coefficients of upper insulation layer, upper conductor pattern and upper PSR layer, respectively, $E_b$, $E_c$ and $E_p$ are elastic moduli of upper insulation layer, upper conductor pattern and upper PSR layer, respectively, and $v_b$, $v_c$ and $v_p$ are volume ratios of upper insulation layer, upper conductor pattern and upper PSR layer, respectively, and an equivalent thermal expansion coefficient $\alpha_{lower}$ of the lower part is defined by the equation of:

$$\alpha_{lower} = \frac{\alpha_b E_b v_b + \alpha_c E_c v_c + \alpha_p E_p v_p}{E_b v_b + E_c v_c + E_p v_p},$$

where $\alpha_b$, $\alpha_c$ and $\alpha_p$ are thermal expansion coefficients of lower insulation layer, lower conductor pattern and lower PSR layer, respectively, $E_b$, $E_c$ and $E_p$ are elastic moduli of lower insulation layer, lower conductor pattern and lower PSR layer, respectively, and $v_b$, $v_c$ and $v_p$ are volume ratios of lower insulation layer, lower conductor pattern and lower PSR layer, respectively, and an equivalent thermal expansion coefficient ratio ($\alpha_{upper}/\alpha_{lower}$) of $\alpha_{upper}$ to $\alpha_{lower}$ is selected to be within a range of between 0.975 and 1.165.

Here, the volume ratio $v_i$ (e.g., $v_b$, $v_c$ and $v_p$) of the upper part is defined by the equation of:

$$v_i = \frac{V_i}{\sum_{i=1}^{n} V_i},$$

which is a respective volume of the particular components (e.g., the upper insulation layer, upper conductor pattern and upper PSR layer) in comparison with the entire volume of the upper part, and the volume ratio $v_j$ (e.g., $v_b$, $v_c$ and $v_p$) of the lower part is defined by the equation of:

$$v_j = \frac{V_j}{\sum_{j=1}^{m} V_j},$$

which is a respective volume of the particular components (e.g., the lower insulation layer, lower conductor pattern and lower PSR layer) in comparison with the entire volume of the lower part.

Preferably, the $\alpha_{upper}/\alpha_{lower}$ is selected to be within a range of between 0.99 and 1.09.

The conductor patterns are preferably formed of copper (Cu), and the insulation layer is preferably formed of a FR-4 or BT resign.

According to another aspect of the present invention, there is provided a unit substrate formed by cutting from a parent substrate and for providing a semiconductor device with the unit substrate. The parent substrate includes: an insulation layer having first and second surfaces opposing to each other; upper and lower conductor patterns respectively formed on the first and second surfaces of the insulation layer; and upper and lower photo solder resist (PSR) layers respectively formed over the first and second surfaces of the insulation layers and covering at least some area of the upper and lower conductor patterns. When the parent substrate defines an upper part and a lower part divided by a reference surface passing through the center line of the insulation layer, an equivalent thermal expansion coefficient $\alpha_{upper}$ of the upper part is defined by the equation of:

$$\alpha_{upper} = \frac{\alpha_b E_b v_b + \alpha_c E_c v_c + \alpha_p E_p v_p}{E_b v_b + E_c v_c + E_p v_p},$$

where $\alpha_b$, $\alpha_c$ and $\alpha_p$ are thermal expansion coefficients of upper insulation layer, upper conductor pattern and upper PSR layer, respectively, $E_b$, $E_c$ and $E_p$ are elastic moduli of upper insulation layer, upper conductor pattern and upper PSR layer, respectively, and $v_b$, $v_c$ and $v_p$ are volume ratios of upper insulation layer, upper conductor pattern and upper PSR layer, respectively, and an equivalent thermal expansion coefficient $\alpha_{lower}$ of the lower part is defined by the equation of:

$$\alpha_{lower} = \frac{\alpha_b E_b v_b + \alpha_c E_c v_c + \alpha_p E_p v_p}{E_b v_b + E_c v_c + E_p v_p},$$

where $\alpha_b$, $\alpha_c$ and $\alpha_p$ are thermal expansion coefficients of lower insulation layer, lower conductor pattern and lower PSR layer, respectively, $E_b$, $E_c$ and $E_p$ are elastic moduli of lower insulation layer, lower conductor pattern and lower PSR layer, respectively, and $v_b$, $v_c$ and $v_p$ are volume ratios of lower insulation layer, lower conductor pattern and lower PSR layer, respectively, and an equivalent thermal expansion coefficient ratio ($\alpha_{upper}/\alpha_{lower}$) of $\alpha_{upper}$ to $\alpha_{lower}$ is selected to be within a range of between 0.975 and 1.165.

Preferably, the $\alpha_{upper}/\alpha_{lower}$ is selected to be within a range of between 0.99 and 1.09.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

The present invention will now be described more in details with reference to the accompanying drawings, in which exemplary embodiments of the invention are shown.

Figure 2A:
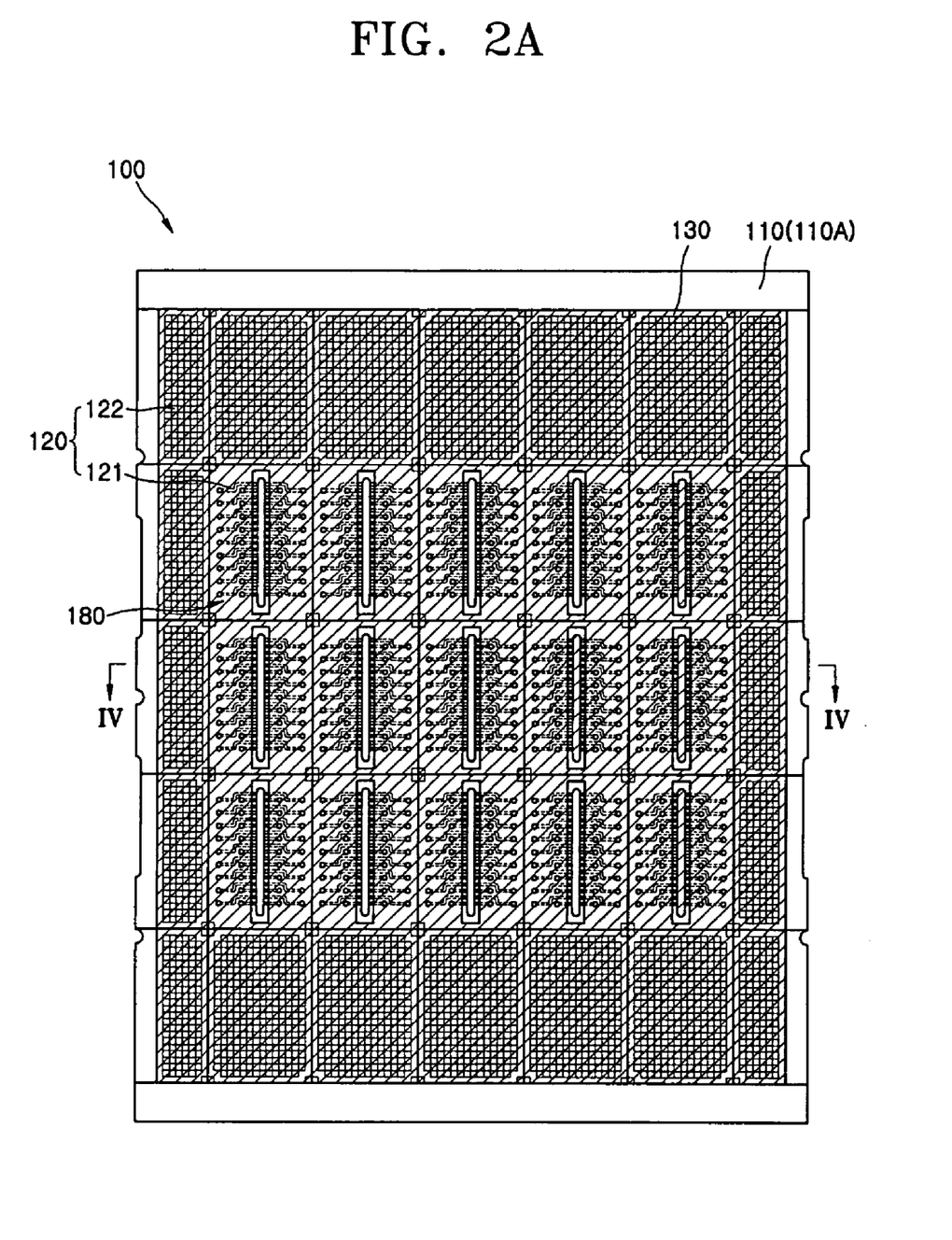
FIG. 2A is a plan view illustrating a surface of a parent or master substrate according to one embodiment of the present invention.
Figure 3:
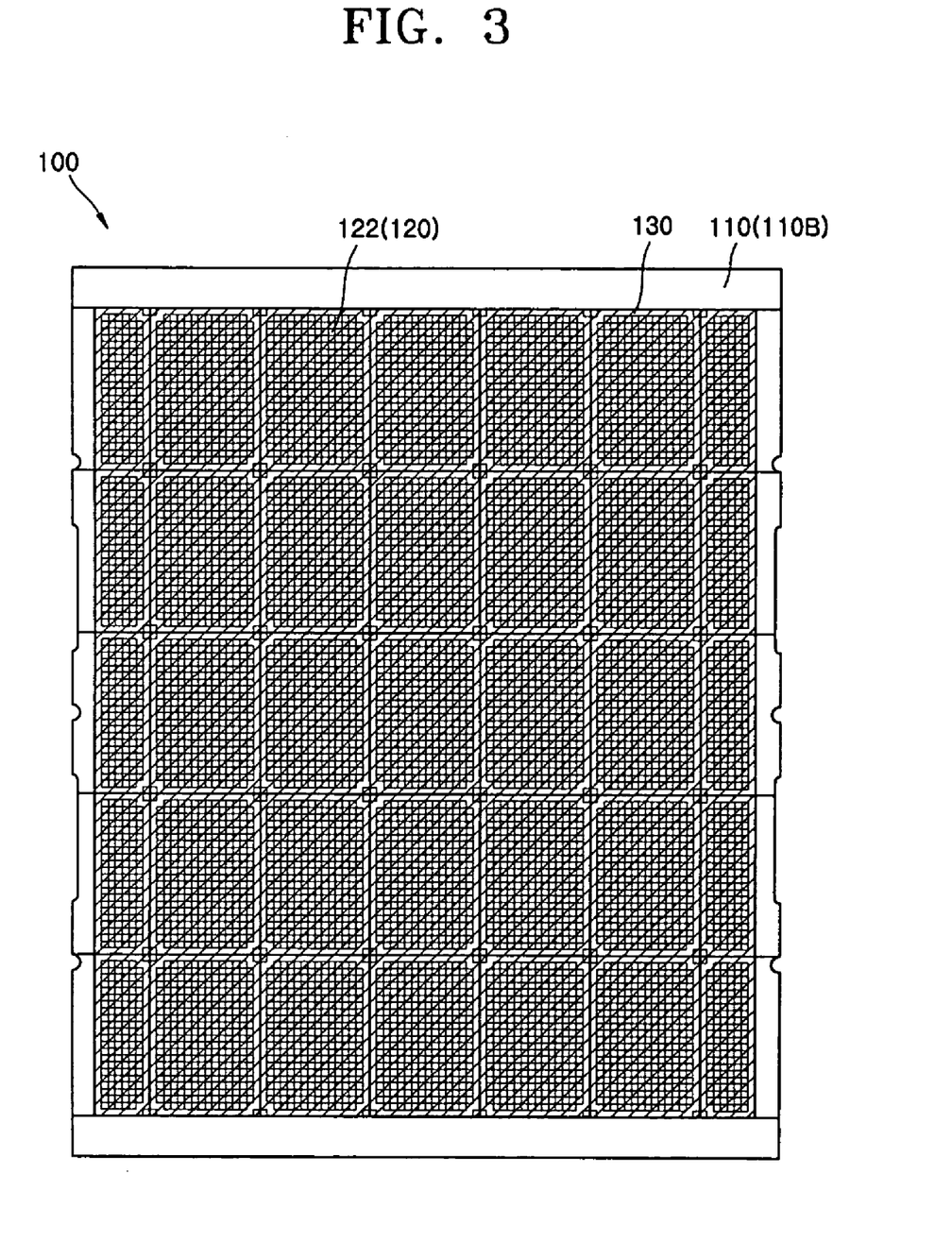
FIG. 3 is a plan view of the parent substrate shown in FIG. 2A, however, illustrating an opposite surface thereof.

FIGS. 2A and 3 illustrate a parent or master substrate 100 (referring to the original substrate containing an array of unit substrates) for producing a plurality of semiconductor packages there-from, constructed according to one embodiment of the present invention, in which FIG. 2A shows one surface of the parent substrate 100, and FIG. 3 shows the other surface of the parent substrate 100.

Referring to FIG. 2A, a plurality of unit substrates 180 are arranged on the parent substrate 100 in matrix or array pattern, which can simultaneously provide a plurality of packages. That is, after a semiconductor chip is attached on each of the unit substrates 180, the parent substrate 100 is sawed into a plurality of individual packages.

Conductor patterns 120 and a photo solder resist (PSR) layer 130 covering the conductor patterns 120 are formed on a first surface 110A of an insulation layer 110 of the parent substrate 100. The insulation layer 110 may be formed of an epoxy resin such as a FR-4 or BT resin. The conductor patterns 120 are formed of a metallic material with superior conductivity, such as a copper material. For example, the conductor patterns 120 can be formed by stacking a thin copper layer and then patterning the thin copper layer typically by photo-lithography.

Some of the conductor patterns 120 are formed within the unit substrates 180 and provides circuit patterns 121 enabling transmission of an electrical signal there-through, and others of the conductor patterns 120 are formed at a peripheral area outside of the array of the unit substrates 180 and thereby forming dummy patterns 122.

Figure 2B:
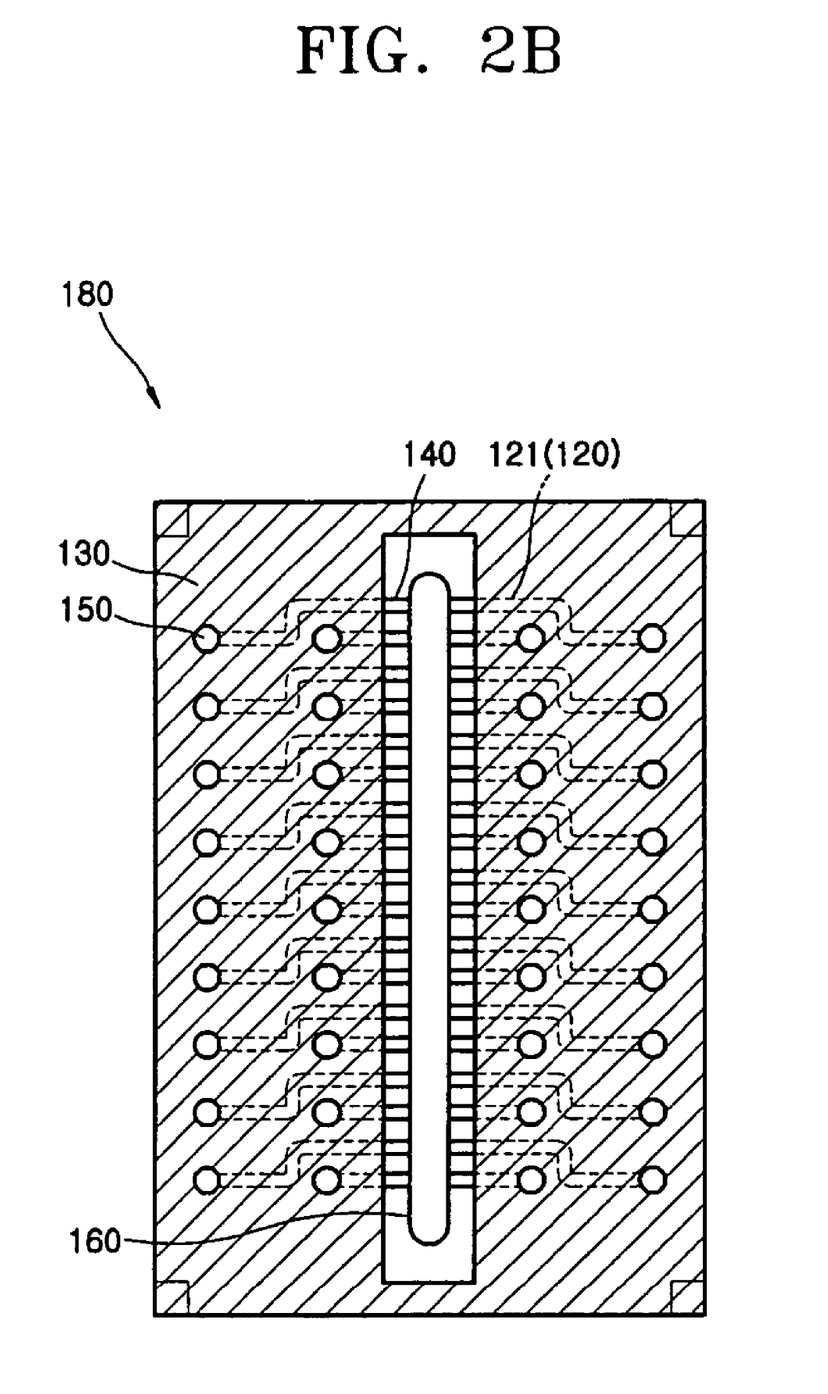
FIG. 2B is an enlarged plan view of a unit substrate shown in FIG. 2A.

FIG. 2B illustrates the details of one unit substrate 180 shown in FIG. 2A.

Referring to FIG. 2B, wire-bonding pads 140 and ball pads 150, which are exposed to the surface of the unit substrate 180, are electrically connected with one another via corresponding circuit patterns 121. When the substrate 180 is assembled with a semiconductor chip (not shown), a conductive wire (not shown) is connected to the respective wire-bonding pad 140, and the circuit pattern 121 is electrically connected to the semiconductor chip by the conductive wire. For this, a slot 160 is formed about at the center of the unit substrate 180, and the conductive wire is extending from an exposed pad of the semiconductor chip and connected to the wire-bonding pad 140 through the slot 160. A solder ball (not shown) is fixedly seated on the ball pad 150, and the circuit pattern 121 is electrically connected to an outer circuit board through the solder ball.

Referring back to FIG. 2A, the dummy patterns 122 merely have a mechanical function, but not an electrical function such as an electrical circuit and a condenser, and can be arranged in a lattice pattern as shown in FIG. 2A. Such dummy patterns 122 are similarly formed on a second surface 110B of the insulation layer 110 as shown in FIG. 3. The dummy patterns 122 are preferably arranged on the whole second surface 110B of the insulation layer 110 in a lattice pattern. Since circuit patterns are not formed on the second surface 110B, conductor patterns 120 formed on the second surface 110B are only dummy patterns 122.

The dummy patterns 122 reinforce the overall strength of the parent substrate 100 and prevent fluttering of the parent substrate 100, and also have an importance function to reduce a bending deformation of the parent substrate 100. Because of the dummy patterns 122 formed on the first and second surface 110A and 110B, the bending deformation of the parent substrate 100 occurring due to the difference in the thermal deformation rates of the first surface 110A (containing the circuit patterns 121) and the second surface 110B (not containing the circuit patterns 121), can be reduced.

Referring now to FIGS. 2A and 2B, photo solder resist layer (PSR layer) 130 is covered over the conductor patterns 120 except the areas of the wire-bonding pads 140 and the ball pads 150 (where corresponding holes are formed). The PSR layer 130 is typically formed by applying a liquid photo solder resist (LPSR) material on the insulation layer 110 which contains the conductor patterns 120 thereon, which is subsequently hardened. According to one embodiment of the invention, the LPSR material is applied through a screen printing method and then dried through a hardening process for several tens of minutes at a temperature of 70° or above. As shown in FIG. 3, the PSR layer 130 is also formed on the second surface 110B of the insulation layer 110 thereby covering the dummy patterns 122.

Figure 4:
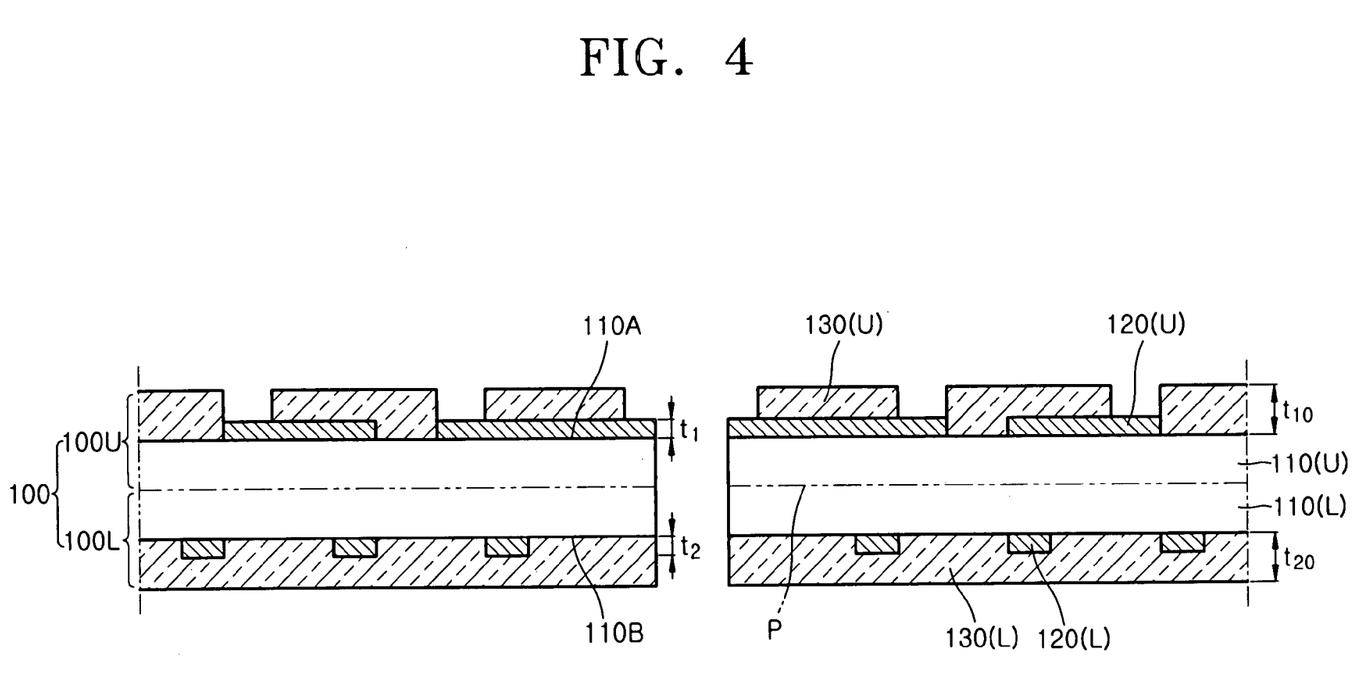
FIG. 4 is an enlarged cross-sectional view of the parent substrate taken along line IV—IV in FIG. 2A, however, showing a portion thereof.

FIG. 4 illustrates a sectional view of the parent substrate taken along line IV—IV in FIG. 2A. In FIG. 4, reference surface P denotes an imaginary or reference surface which divides the parent substrate 100 into two parts (e.g., an upper part 100U and a lower part 100L) that have the same thickness, and reference "U" following after the respective reference numerals indicates an upper portion of the referenced member, and reference "L" indicates a lower part of the referenced member or components. Thus, upper conductor patterns 120(U) of the upper part 100U indicate the circuit patterns 121 and the dummy patterns 122, collectively, which are formed on the first (upper) surface 110A of the insulation layer 110 (see FIG. 2A), and lower conductor patterns 120(L) of the lower part 100L indicate the dummy patterns 122 formed on the second (lower) surface 110B of the insulation layer 110 (see FIG. 3). The upper conductor patterns 120(U) and the lower conductor patterns 120(L) have a different pattern relative to each other, and thus the upper part 100U and the lower part 100L contain different amount of conductive metals (e.g., copper (Cu)). Accordingly, the parent substrate 100 has the potential to become bent particularly when it is subject to a subsequent thermal process such as the curing process of the LPSR layer. However, the present invention can effectively reduce such a bending deformation by adjusting the amount or volume ratios of respective components in the parent substrate 100. This will be further described later.

From the thermal expansion coefficients $\alpha_b$, $\alpha_c$ and $\alpha_p$, elastic moduli $E_b$, $E_c$ and $E_p$ and volume ratios $v_b$, $v_c$ and $v_p$ of the upper insulation layer 110(U), upper conductor pattern 120 (U) and upper PSR layer 130(U), respectively, an equivalent thermal expansion $\alpha_{upper}$ of the upper part 100U can be defined by the following Equation (1). Here, the subscripts b, c and p are used to respectively indicate the upper insulation layer 110(U), the upper conductor pattern 120(U) and the upper PSR layer 130(U) with regard to each of the above values.

$$\alpha_{upper} = \frac{\alpha_b E_b v_b + \alpha_c E_c v_c + \alpha_p E_p v_p}{E_b v_b + E_c v_c + E_p v_p} \quad (1)$$

where the volume ratios $v_b$, $v_c$ and $v_p$ are, respectively, the ratios in the volume of upper insulation layer 110(U), upper conductor pattern 120(U) and upper PSR layer 130(U) in comparison with the volume of the overall upper part 100U. Thus, for example, the volume ratio $v_p$ of the upper PSR layer 130(U) can be defined by the following Equation (2):

$$v_p = \frac{V_p}{V_b + V_c + V_p} \quad (2)$$

where $v_b$, $v_c$ and $v_p$ respectively represent the volume of upper insulation layer 110(U), upper conductor pattern 120 (U) and upper PSR layer 130(U).

The thermal expansion coefficients $\alpha_b$, $\alpha_c$ and $\alpha_p$ and the elastic moduli $E_b$, $E_c$ and $E_p$ of the upper insulation layer 110(U), the upper conductor pattern 120 (U) and the upper PSR layer 130(U) are shown in the following Table 1. The thermal expansion coefficients $\alpha_b$, $\alpha_c$ and $\alpha_p$ and the elastic moduli $E_b$, $E_c$ and $E_p$ are inherent constants of the particular materials and are, therefore, identical to that of the lower part 100L.

TABLE 1

| | Thermal Expansion Coefficient | Elastic Modulus |
|---|---|---|
| Insulation Layer (FR-4) | 11 × 10−6/k | 13 GPa |
| Conductor Pattern (Cu) | 17 × 10−6/k | 121 GPa |
| PSR Layer | 55 × 10−6/k | 2.4 GPa |

Similarly, from thermal expansion coefficients $\alpha_b$, $\alpha_c$ and $\alpha_p$, elastic moduli $E_b$, $E_c$ and $E_p$ and volume ratios $v_b$, $v_c$ and $v_p$ of lower insulation layer 110(L), lower conductor pattern 120 (L) and lower PSR layer 130(L) of the lower part 100U, an equivalent thermal expansion $\alpha_{lower}$ of the lower part 100L can be defined by the following Equation (3). Here, the subscripts b, c and p represent the value (i.e., thermal expansion coefficient, elastic modulus and volume ratio) of the lower insulation layer 110(L), the lower conductor pattern 120(L) and the lower PSR layer 130(L), respectively.

$$\alpha_{lower} = \frac{\alpha_b E_b v_b + \alpha_c E_c v_c + \alpha_p E_p v_p}{E_b v_b + E_c v_c + E_p v_p} \quad (3)$$

where the volume ratios $v_b$, $v_c$ and $v_p$ are, respectively, the ratios in the volume of lower insulation layer 110(L), lower conductor pattern 120(L) and lower PSR layer 130(L) in comparison with the volume of the overall lower part 100L. Thus, for example, the volume ratio $v_c$ of the lower conductor pattern 120(L) can be defined by the following Equation (4):

$$v_c = \frac{V_c}{V_b + V_c + V_p} \quad (4)$$

where $v_b$, $v_c$ and $v_p$ respectively represent the volume of lower insulation layer 110(L), lower conductor pattern 120 (L) and lower PSR layer 130(L).

Figure 5:
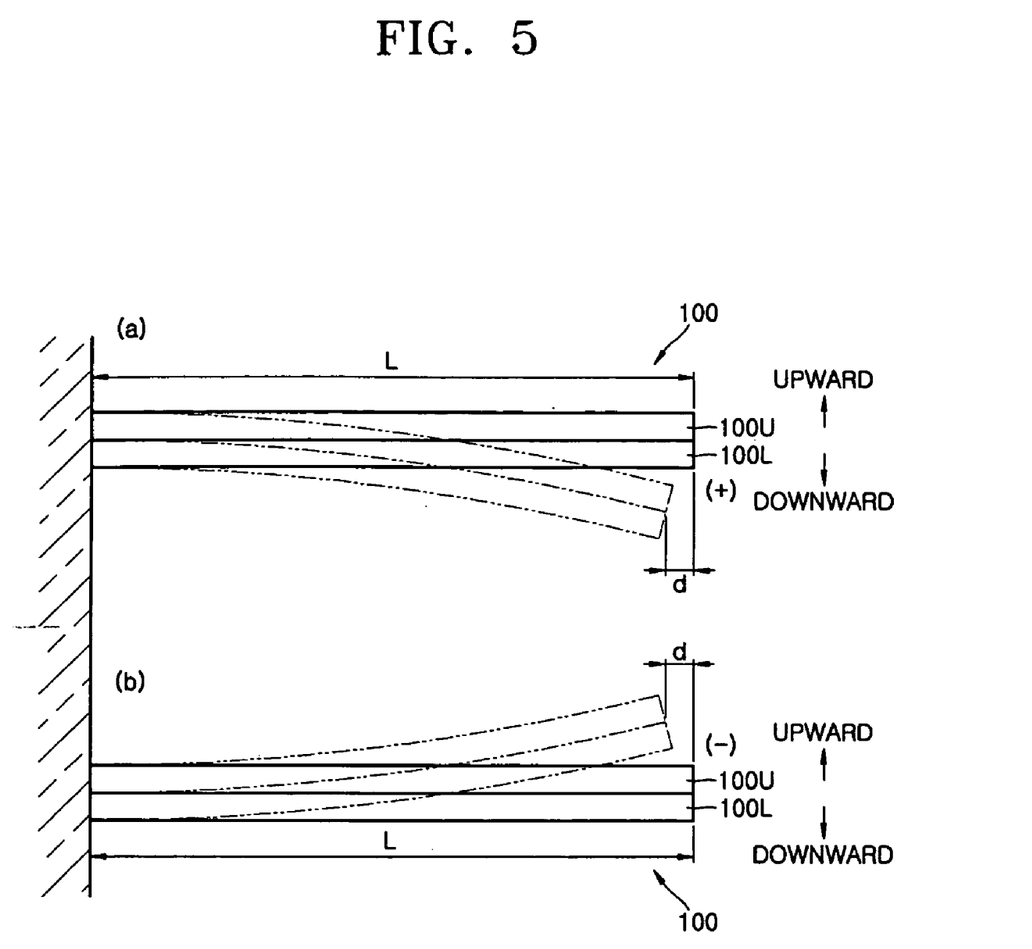
FIG. 5 is a schematic side view illustrating a bending phenomenon of the parent substrate often occurring during the fabrication process.

As shown in FIG. 5, when the upper part 100U and the lower part 100L having different thermal expansion coefficients are exposed to a temperature change, the two parts become different in their lengths and thereby causing bending of the parent substrate 100. Accordingly, as suggested in the following Equation (5), a bending deformation of the parent substrate 100 can be predicted by an equivalent thermal expansion coefficient ratio $\alpha_{ratio}$ (hereinafter referred to as an equivalent CTE ratio), which is defined as a ratio of $\alpha_{upper}$ to $\alpha_{lower}$.

$$\alpha_{ratio} = \frac{\alpha_{upper}}{\alpha_{lower}} \quad (5)$$

Figure 6:
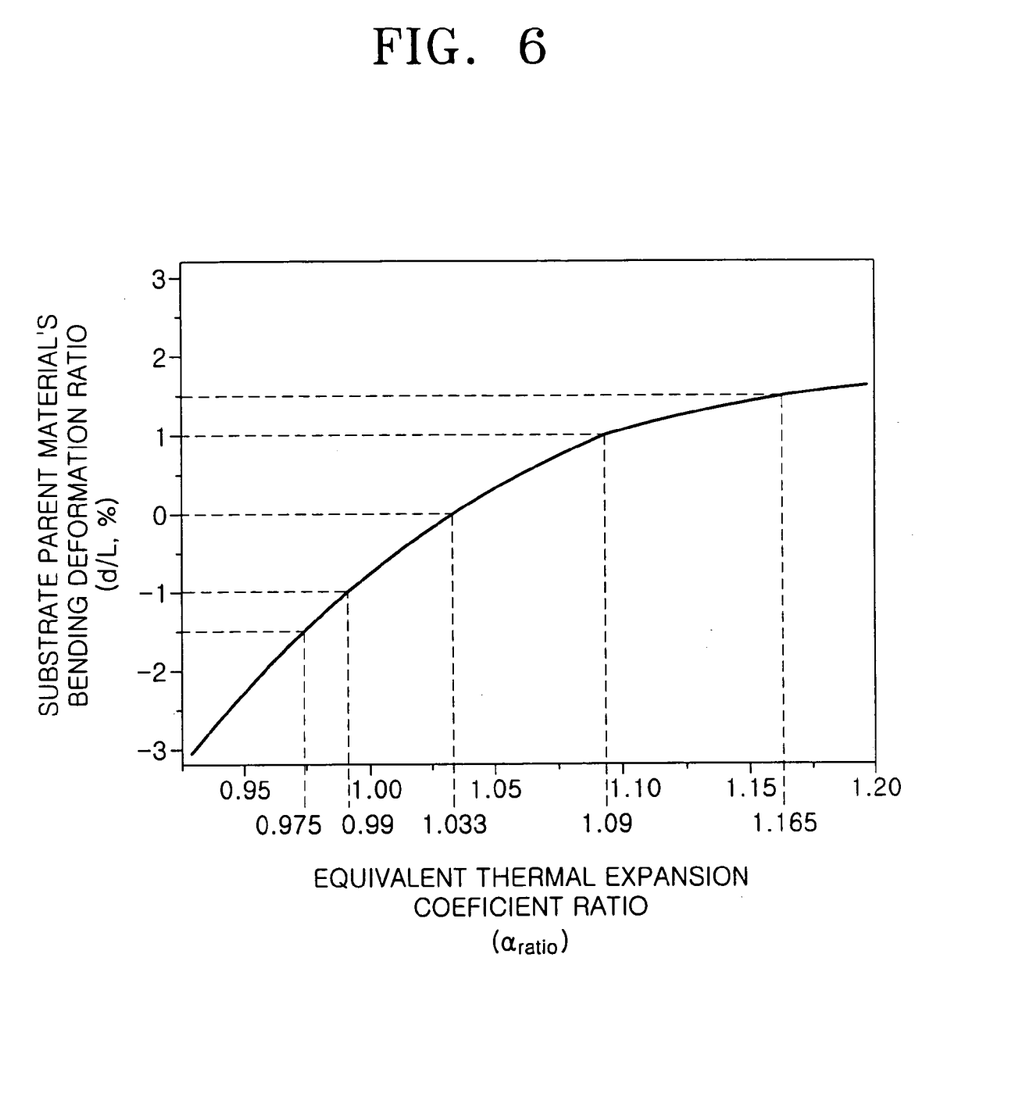
FIG. 6 is a graph illustrating the relationship between an equivalent thermal expansion coefficient ratio and a bending deformation ratio of a parent substrate.

More specifically, as shown in FIG. 6, a bending deformation ratio of the parent substrate is generally proportional to the equivalent CTE ratio $\alpha_{ratio}$. This is the result obtained from calculating the bending deformation ratios (d/L) of parent substrate having various equivalent CTE ratios ($\alpha_{ratio}$) by using a finite element method (FEM). Referring to FIG. 5, the bending deformation ratio d/L is a ratio of a length decrease (d) in a parent substrate 100 caused by bending, with regard to the length (L) of the parent substrate 100. The bending deformation ratio d/L is defined to be positive when the parent substrate 100 is bent downward as shown in FIG. 5(a), and the bending deformation ratio d/L is defined to be negative when the parent substrate 100 is bent upward as shown in FIG. 5(b).

Referring to FIG. 6, when the equivalent CTE ratio $\alpha_{ratio}$ is 1.033, the bending deformation ratio d/L becomes 0%. If $\alpha_{ratio}$ is increased above 1.033, d/L becomes positive, and if $\alpha_{ratio}$ is decreased below 1.033, d/L becomes negative. As shown, the bending deformation ratio d/L is about proportional to the equivalent CTE ratio $\alpha_{ratio}$. In order to maintain the bending deformation ratio d/L to be within a general allowance range of between −1% and +1%, it is preferable that the equivalent CTE ratio $\alpha_{ratio}$ is set to be within a range of between 0.99 and 1.09. Since the bending deformation of a parent substrate can be reduced through selection of the curing condition of the PSR layer and/or through the annealing process after the curing, the equivalent CTE ratio $\alpha_{ratio}$ may be set to be within a range of between 0.975 and 1.165 in order to maintain the bending deformation ratio d/L to be within a range of between −1.5% and +1.5%, which is less restricted than the general allowance range described above.

Further descriptions are made herein with regard to a method of designing a parent substrate having a specific equivalent CTE ratio $\alpha_{ratio}$. As discussed above, the equivalent CTE ratio $\alpha_{ratio}$ is defined as a ratio of $\alpha_{upper}$ to $\alpha_{lower}$ as specified in Equation 5, and $\alpha_{upper}$ and $\alpha_{lower}$ are respectively obtained from Equations 1 and 3. Since the thermal expansion coefficients $\alpha_b$, $\alpha_c$ and $\alpha_p$ and the elastic moduli $E_b$, $E_c$ and $E_p$ of respective components are constants inherent in the particular materials, a target CTE ratio $\alpha_{ratio}$ can be obtained by adjusting the volume ratios $v_b$, $v_c$ and $v_p$ of the respective components.

Describing further with reference to FIG. 4, in order to adjust the respective surface areas of the conductor patterns 120(U) and 120(L) or the PSR layers 130(U) and 130(L), a design change in the semiconductor package is required. Therefore, it is convenient to adjust the thickness of each component, but not the area of each component. However, since the dimensions of the conductor patterns 120(U) and 120(L) are closely related to the electrical performance of the semiconductor package, it is also not easy to adjust the thicknesses t1 and t2 of the conductor patterns 120(U) and 120(L). Accordingly, in order to set the equivalent CTE ratio $\alpha_{ratio}$ to be within the allowance range, it is preferable to adjust the thicknesses t10 and t20 of the PSR layers 130(U) and 130(L) that do not directly change the performance of the semiconductor package.

The following experiments were performed in order to ascertain the decrease in the bending deformation by adjusting the thicknesses of the PSR layers and also to compare the results of the FEM analysis as illustrated in FIG. 6 with the results of actual product test. In these experiments, the FEM analyses and the actual product tests were performed with respect to two parent substrates whose PSR layers in the upper part have a different thickness, and bending deformations of the two parent substrates were obtained. The results of the experiments were shown in the following Table 2.

TABLE 2

|  | Upper part - PSR Layer's thickness | Lower part - PSR Layer's thickness | Equivalent CTE Ratio | Bending deformation obtained from FEM | Bending deformation obtained from Actual Product Test |
|---|---|---|---|---|---|
| Experiment 1 | 40 μm | 30 μm | 1.0885 | 1 | 1 |
| Experiment 2 | 25 μm | 30 μm | 1.0045 | 0.24 | 0.34 |

Here, the bending deformation obtained from Experiment 2 represents a relative degree in the bending deformation that was obtained when the bending deformation from Experiment 1 was set to be 1. As shown in Table 2, the bending deformation 0.24 obtained from the FEM analysis and the bending deformation 0.34 obtained from the actual product test are somewhat different to each other, but they are in a range substantially similar to each other. As shown in the analysis results of both of the FEM analysis and the actual product test, the bending deformation in the Experiment 2 was more reduced than that obtained from the Experiment 1. More specifically, as in the above experiment results, the bending deformation in the Experiment 2 is decreased by 60% or more when it was compared with the bending deformation in the Experiment 1. As described above, the bending deformation can be considerably reduced by adjusting the thicknesses of the PSR layers.

According to the present invention described above, optimal or desirable design requirements of the parent substrate (and the unit substrates obtained from the parent substrate) can be effectively determined in order to reduce or minimize the bending deformation of the parent substrate. That is, by providing the design parameters (such as the thickness of the PSR layers and equivalent CTE ratios) and their allowance ranges for the permissible standards of bending deformation, the parent substrate can be easily handled without having the handling difficulties caused by excessive deformation of the substrate during successive processes performed after formation of the parent substrate, thus improving a product yield of the packages. As a consequence, in the respective unit substrates sawed out of the parent substrate, co-planarity of the solder balls is improved, and the connectivity between the semiconductor package and an outer circuit board is enhanced while reducing bad contacts there-between.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A parent substrate for producing a plurality of unit substrates for a semiconductor device, the parent substrate comprising:
   an insulation layer having first and second surfaces opposing to each other;
   upper and lower conductor patterns respectively formed on the first and second surfaces of the insulation layer; and
   upper and lower photo solder resist (PSR) layers respectively formed over the first and second surfaces of the insulation layers and covering at least some area of the upper and lower conductor patterns,
   wherein the parent substrate defines an upper part and a lower part divided by a reference surface passing through the center line of the insulation layer,
   wherein, when an equivalent thermal expansion coefficient $\alpha_{upper}$ of the upper part is defined as follows:

$$\alpha_{upper} = \frac{\alpha_b E_b v_b + \alpha_c E_c v_c + \alpha_p E_p v_p}{E_b v_b + E_c v_c + E_p v_p}$$

where $\alpha_b$, $\alpha_c$ and $\alpha_p$ are thermal expansion coefficients of upper insulation layer, upper conductor pattern and upper PSR layer, respectively, $E_b$, $E_c$ and $E_p$ are elastic moduli of upper insulation layer, upper conductor pattern and upper PSR layer, respectively, and $v_b$, $v_c$ and $v_p$ are volume ratios of upper insulation layer, upper conductor pattern and upper PSR layer, respectively, and when an equivalent thermal expansion coefficient $\alpha_{lower}$ of the lower part is defined as follows:

$$\alpha_{lower} = \frac{\alpha_b E_b v_b + \alpha_c E_c v_c + \alpha_p E_p v_p}{E_b v_b + E_c v_c + E_p v_p}$$

where $\alpha_b$, $\alpha_c$ and $\alpha_p$ are thermal expansion coefficients of lower insulation layer, lower conductor pattern and lower PSR layer, respectively, $E_b$, $E_c$ and $E_p$ are elastic moduli of lower insulation layer, lower conductor pattern and lower PSR layer, respectively, and $v_b$, $v_c$ and $v_p$ are volume ratios of lower insulation layer, lower conductor pattern and lower PSR layer, respectively, an equivalent thermal expansion coefficient ratio ($\alpha_{upper}/\alpha_{lower}$) of $\alpha_{upper}$ to $\alpha_{lower}$ is selected to be within a range of between 0.975 and 1.165.

2. The parent substrate of claim 1, wherein the $\alpha_{upper}/\alpha_{lower}$ is selected to be within a range of between 0.99 and 1.09.

3. The parent substrate of claim 1, wherein the upper and lower conductor patterns are formed of copper (Cu) and the insulation layer is formed of a FR-4 or BT resin.

4. The parent substrate of claim 1, wherein the upper conductor patterns formed on the first surface of the insulation layer include an array of circuit patterns for unit substrates disposed at a central area of the parent substrate for transmitting electrical signals there-through, and an array of dummy patterns disposed at a peripheral area of the parent substrate.

5. The parent substrate of claim 4, wherein the upper and lower PSR layers are respectively covers the entire surface of the upper and lower conductor patterns with the exception of certain areas on the circuit patterns.

6. The parent substrate of claim 1, wherein the lower conductor patterns formed on the second surface of the insulation layer are an array of dummy patterns not transmitting an electrical signal.

7. A unit substrate formed by cutting out of a parent substrate for providing a semiconductor package, the parent substrate comprising:
   an insulation layer having first and second surfaces opposing to each other;
   upper and lower conductor patterns respectively formed on the first and second surfaces of the insulation layer; and
   upper and lower photo solder resist (PSR) layers respectively formed over the first and second surfaces of the insulation layers and covering at least some area of the upper and lower conductor patterns, wherein the parent substrate defines an upper part and a lower part divided by a reference surface passing through the center line of the insulation layer, wherein, when an equivalent thermal expansion coefficient $\alpha_{upper}$ of the upper part is defined as follows:

$$\alpha_{upper} = \frac{\alpha_b E_b v_b + \alpha_c E_c v_c + \alpha_p E_p v_p}{E_b v_b + E_c v_c + E_p v_p}$$

where $\alpha_b$, $\alpha_c$ and $\alpha_p$ are thermal expansion coefficients of upper insulation layer, upper conductor pattern and upper PSR layer, respectively, $E_b$, $E_c$ and $E_p$ are elastic moduli of upper insulation layer, upper conductor pattern and upper PSR layer, respectively, and $v_b$, $v_c$ and $v_p$ are volume ratios of upper insulation layer, upper conductor pattern and upper PSR layer, respectively, and when an equivalent thermal expansion coefficient $\alpha_{lower}$ of the lower part is defined as follows:

$$\alpha_{lower} = \frac{\alpha_b E_b v_b + \alpha_c E_c v_c + \alpha_p E_p v_p}{E_b v_b + E_c v_c + E_p v_p}$$

where $\alpha_b$, $\alpha_c$ and $\alpha_p$ are thermal expansion coefficients of lower insulation layer, lower conductor pattern and lower PSR layer, respectively, $E_b$, $E_c$ and $E_p$ are elastic moduli of lower insulation layer, lower conductor pattern and lower PSR layer, respectively, and $v_b$, $v_c$ and $v_p$ are volume ratios of lower insulation layer, lower conductor pattern and lower PSR layer, respectively, an equivalent thermal expansion coefficient ratio ($\alpha_{upper}/\alpha_{lower}$) of $\alpha_{upper}$ to $\alpha_{lower}$ is selected to be within a range of between 0.975 and 1.165.

8. The unit substrate of claim 7, wherein the $\alpha_{upper}/\alpha_{lower}$ is selected to be within a range of between 0.99 and 1.09.

* * * * *